(12) United States Patent
Nakamura et al.

(10) Patent No.: US 12,041,370 B2
(45) Date of Patent: Jul. 16, 2024

(54) IMAGING APPARATUS AND ELECTRONIC DEVICE

(71) Applicant: SONY SEMICONDUCTOR SOLUTIONS CORPORATION, Kanagawa (JP)

(72) Inventors: Shunya Nakamura, Kanagawa (JP); Isao Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 46 days.

(21) Appl. No.: 17/906,577

(22) PCT Filed: Mar. 23, 2021

(86) PCT No.: PCT/JP2021/011921
§ 371 (c)(1),
(2) Date: Sep. 16, 2022

(87) PCT Pub. No.: WO2021/200386
PCT Pub. Date: Oct. 7, 2021

(65) Prior Publication Data
US 2023/0188869 A1 Jun. 15, 2023

(30) Foreign Application Priority Data
Mar. 31, 2020 (JP) ................................ 2020-062174

(51) Int. Cl.
*H04N 25/772* (2023.01)
*H01L 23/552* (2006.01)
(Continued)

(52) U.S. Cl.
CPC ....... *H04N 25/7795* (2023.01); *H01L 23/552* (2013.01); *H01L 27/14634* (2013.01);
(Continued)

(58) Field of Classification Search
None
See application file for complete search history.

(56) References Cited

U.S. PATENT DOCUMENTS

2019/0208151 A1* 7/2019 Taura ................ H03M 1/34
2019/0364235 A1* 11/2019 Honda ............... H04N 25/772
(Continued)

FOREIGN PATENT DOCUMENTS

| JP | 2019-134230 A | 8/2019 |
|---|---|---|
| JP | 2020-048066 A | 3/2020 |
| WO | 2016/136448 A1 | 9/2016 |

OTHER PUBLICATIONS

International Search Report and Written Opinion of PCT Application No. PCT/JP2021/011921, issued on Jun. 15, 2021, 08 pages of ISRWO.

*Primary Examiner* — Paul M Berardesca
(74) *Attorney, Agent, or Firm* — CHIP LAW GROUP

(57) ABSTRACT

Provided are an imaging apparatus and an electronic device for suppressing a delay of a control signal according to a position of a pixel in a horizontal direction. A time code generation unit is provided on a first side of a pixel array, a signal processing unit is provided on a second side, of the pixel array, opposite to the first side, a timing generation circuit is provided on the second side of the pixel array, each of a plurality of transfer units is disposed from the first side to the second side through the pixel array, and a control line for transferring a timing signal generated by the timing signal generation unit to the time code generation unit is provided in each of two or more transfer units of the plurality of transfer units.

11 Claims, 17 Drawing Sheets

(51) Int. Cl.
  *H01L 27/146* (2006.01)
  *H04N 25/701* (2023.01)
  *H04N 25/76* (2023.01)
  *H04N 25/766* (2023.01)
  *H04N 25/78* (2023.01)
  *H04N 25/79* (2023.01)
(52) U.S. Cl.
  CPC ..... *H01L 27/14636* (2013.01); *H04N 25/701* (2023.01); *H04N 25/766* (2023.01); *H04N 25/772* (2023.01); *H04N 25/78* (2023.01); *H04N 25/79* (2023.01)

(56) References Cited

U.S. PATENT DOCUMENTS

| | | | | |
|---|---|---|---|---|
| 2021/0329188 | A1* | 10/2021 | Kawasaki | H04N 25/767 |
| 2022/0295000 | A1* | 9/2022 | Yamazaki | H04N 25/79 |
| 2023/0345148 | A1* | 10/2023 | Mao | H04N 25/768 |
| 2023/0379600 | A1* | 11/2023 | Yagami | H04N 25/772 |

* cited by examiner

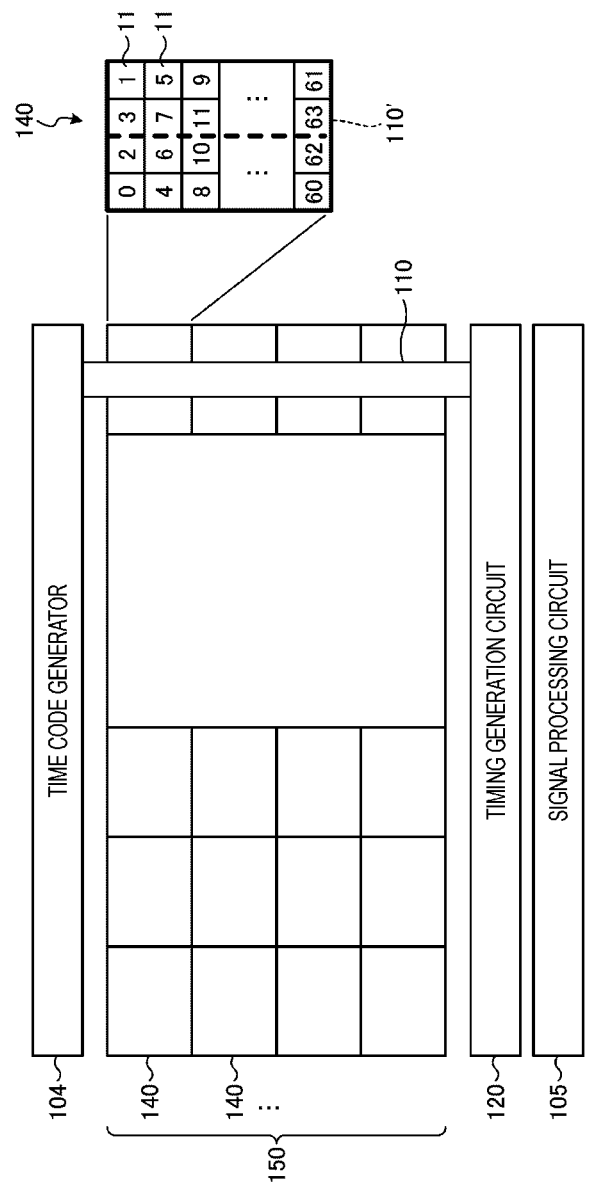

IMAGING APPARATUS AND ELECTRONIC DEVICE

CROSS REFERENCE TO RELATED APPLICATIONS

This application is a U.S. National Phase of International Patent Application No. PCT/JP2021/011921 filed on Mar. 23, 2021, which claims priority benefit of Japanese Patent Application No. JP 2020-062174 filed in the Japan Patent Office on Mar. 31, 2020. Each of the above-referenced applications is hereby incorporated herein by reference in its entirety.

TECHNICAL FIELD

The present disclosure relates to an imaging apparatus and an electronic device.

BACKGROUND ART

An imaging element using an in-pixel ADC architecture including an analog to digital converter (ADC) that converts a pixel signal, that is, an analog signal, into a digital signal in a pixel is known. In this in-pixel ADC architecture, a control signal line for controlling a circuit is wired from timing generation circuits disposed at both ends of a pixel array in a horizontal direction to a circuit block that performs pixel control such as an ADC and a time code generator.

CITATION LIST

Patent Document

Patent Document 1: WO 16/136448 A

SUMMARY OF THE INVENTION

Problems to be Solved by the Invention

In the related art, a linear sensor that detects movement in a specific direction is known. In a case where the linear sensor is configured including the imaging apparatus, the imaging element has a structure in which the number of pixels is larger in the horizontal direction in which the control signal to each pixel is transferred than in the vertical direction in which the pixel signal is transferred, for example. In a case where the above-described in-pixel ADC architecture is applied to such an imaging apparatus, the control signal line wired from the timing generation circuit is long, and the load of the control signal line increases. Accordingly, a propagation delay occurs in the control signal line with respect to the horizontal direction of the imaging element.

The delay time due to the propagation delay increases as the distance from the timing generation circuit increases. Therefore, at the timing of the control signal propagated to the control signal line, a perspective difference occurs according to the distance from the timing generation circuit, and this perspective difference leads to shading of the captured image. In addition, since the delay time itself increases, high-speed responsiveness deteriorates, and it is difficult to increase the frame rate.

An object of the present disclosure is to provide an imaging apparatus and an electronic device capable of suppressing a delay of a control signal according to a position of a pixel in a horizontal direction.

Solution to Problems

An imaging apparatus according to the present disclosure includes a pixel array in which pixels are arranged in a matrix array, each pixel including a light receiving element that generates a charge by photoelectric conversion according to received light, a pixel circuit that reads the charge from the light receiving element to output an analog signal corresponding to the charge, and a conversion circuit that compares the analog signal with a reference signal whose voltage changes with time and converts the analog signal into pixel data that is a digital signal on the basis of a time code whose value is updated every unit time according to a comparison result, a time code generation unit that generates the time code, a signal processing unit that performs a signal process on the pixel data, a timing signal generation unit that generates a timing signal for controlling at least timing at which the time code is generated in the time code generation unit, and a plurality of transfer units that transfers the time code to each of the pixels and transfers the pixel data to the signal processing unit, in which the time code generation unit is provided on a first side of the pixel array, the signal processing unit is provided on a second side, of the pixel array, opposite to the first side, the timing generation circuit is provided on the second side of the pixel array, each of the plurality of transfer units is disposed from the first side to the second side through the pixel array, and a control line for transferring the timing signal generated by the timing signal generation unit to the time code generation unit is provided in each of two or more transfer units of the plurality of transfer units.

BRIEF DESCRIPTION OF DRAWINGS

FIG. 10A is a schematic diagram illustrating an example of access to a pixel array unit by a transfer circuit applicable to an embodiment.

FIG. 14A is a diagram illustrating an example of a layout of a solid state imaging element according to an existing technology.

MODE FOR CARRYING OUT THE INVENTION

Figure 1:
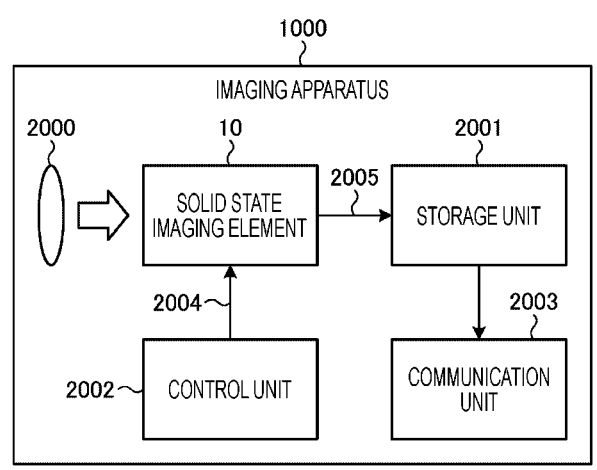
FIG. 1 is a block diagram illustrating a configuration of an example of an electronic device applicable to an embodiment of the present disclosure.

Hereinafter, embodiments of the present disclosure will be described in detail on the basis of the drawings. Note that, in the following embodiment, the same parts are denoted by the same reference numerals, and redundant description will be omitted.

Hereinafter, embodiments of the present disclosure will be described in the following order.

1. Configuration applicable to embodiment
2. Configuration according to embodiment
2-1. Timing generation circuit
2-2. Transfer circuit
2-3. Shield structure
2-4. Effects according to embodiment
3. First modification of embodiment
4. Second modification of embodiment

1. Configuration Applicable to Embodiment

First, a configuration applicable to an embodiment of the present disclosure will be described. FIG. 1 is a block diagram illustrating a configuration of an example of an electronic device 1000 applicable to an embodiment of the present disclosure. The electronic device 1000 is a device that captures image data, and includes an optical unit 2000, a solid state imaging element 10, a storage unit 2001, a control unit 2002, and a communication unit 2003.

The optical unit 2000 condenses incident light and guides the light to the solid state imaging element 10. The solid state imaging element 10 includes a pixel array in which pixels that output pixel signals in accordance with incident light are disposed in a matrix array, and performs imaging in accordance with incident light to output image data. The solid state imaging element 10 supplies image data of imaging output to the storage unit 2001 via a signal line 2005.

The storage unit 2001 can store image data supplied from the solid state imaging element 10. The control unit 2002 causes the solid state imaging element 10 to execute imaging processing. The control unit 2002 supplies various synchronization signals for controlling imaging timing and the like to the solid state imaging element 10 via a signal line 2004, for example.

The communication unit 2003 communicates between the electronic device 1000 and an external device, and can transmit image data read from the storage unit 2001 to the outside, for example.

Figure 2:
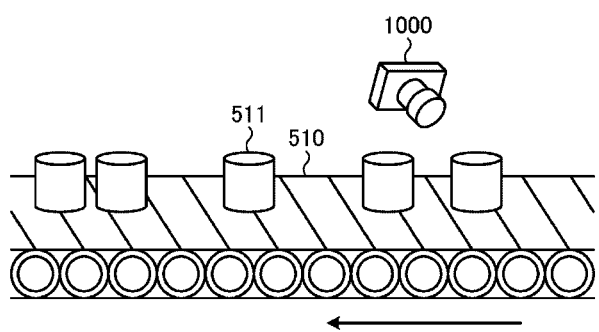
FIG. 2 is a schematic diagram for explaining a usage example of an electronic device applicable to an embodiment.

FIG. 2 is a schematic diagram for describing a usage example of the electronic device 1000 applicable to the embodiment. As illustrated in FIG. 2, the electronic device 1000 can be used in a factory provided with a belt conveyor 510.

The belt conveyor 510 moves a subject 511 in a predetermined direction at a constant speed. The electronic device 1000 is fixed in the vicinity of the belt conveyor 510, and captures an image of the subject 511 to generate image data. The image data is used for inspection of the presence or absence of a defect, for example. As a result, factory automation (FA) is realized.

Note that, in FIG. 2, an example in which the electronic device 1000 captures an image of the subject 511 moving at a constant speed is described, but a usage example of the electronic device 1000 is not limited to this example. For example, the electronic device 1000 may be configured to move at a constant speed with respect to a subject and perform imaging, such as aerial imaging.

Figure 3:
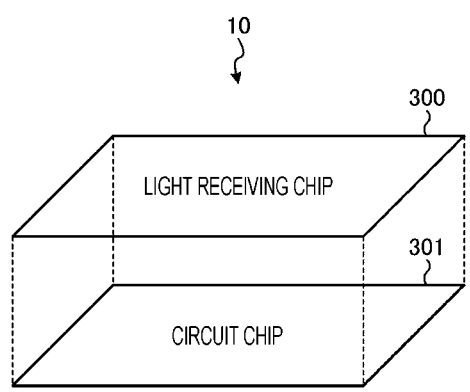
FIG. 3 is a diagram illustrating an example of a laminated structure of the solid state imaging element as an imaging apparatus applicable to an embodiment.

FIG. 3 is a diagram illustrating an example of a laminated structure of the solid state imaging element 10 as an imaging apparatus applicable to the embodiment. The solid state imaging element 10 includes a circuit chip 301 and a light receiving chip 300 bonded to the circuit chip 301 in the laminated structure. The light receiving chip 300 and the circuit chip 301 are electrically connected via a connection portion such as a via. Note that, instead of the vias, electrical connection between the light receiving chip 300 and the circuit chip 301 can be realized by Cu—Cu bonding or bumps.

Figure 4:
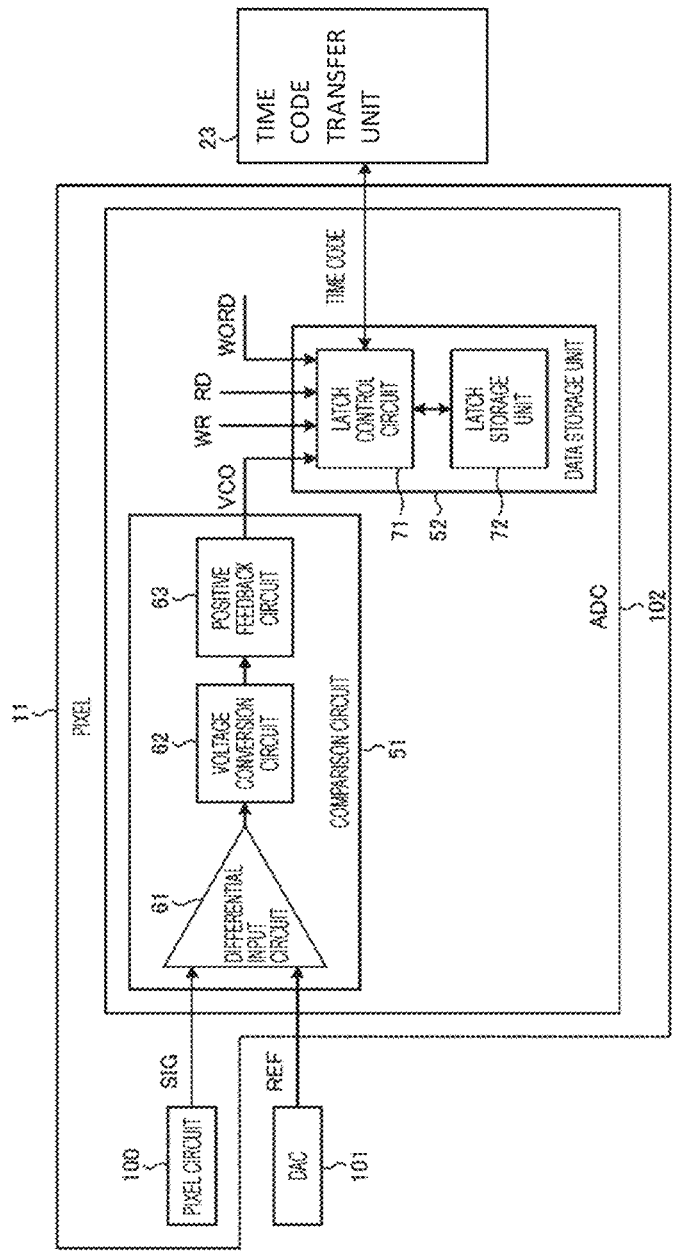
FIG. 4 is a block diagram illustrating a configuration of an example of a pixel applicable to an embodiment.

FIG. 4 is a block diagram illustrating a configuration of an example of a pixel 11 applicable to the embodiment. As illustrated in FIG. 4, the pixel 11 includes a pixel circuit 100 and an analog to digital converter (ADC) 102.

The pixel circuit 100 outputs a charge signal corresponding to the amount of received light as an analog pixel signal SIG to the ADC 102. The pixel circuit 100 includes a photodiode as a light receiving element, a discharge transistor that discharges the charge accumulated in the photodiode according to the signal OFG and adjusts the exposure time, a transfer transistor that transfers the charges accumulated in the photodiode according to the signal TRG to the floating diffusion layer (FD), and a reset transistor that resets the FD according to the signal RST.

The pixel circuit 100 discharges the charges accumulated in the photodiode with the discharge transistor turned on by the signal OFG, whereby exposure is started. After the FD is reset with the reset transistor turned on by the signal RST, the transfer transistor is turned on by the signal TRG, and the charges accumulated in the photodiode by exposure is transferred to the FD and accumulated therein. The electric charges accumulated in the FD is read from the FD to be converted into a voltage, and, as an analog pixel signal SIG, is output from the pixel circuit 100.

The ADC 102 converts the analog pixel signal SIG supplied from the pixel circuit 100 into a digital signal. The ADC 102 includes a comparison circuit 51 and a data storage unit 52. The comparison circuit 51 compares the reference signal REF supplied from a digital to analog converter (DAC) 101 with the pixel signal SIG to output an output signal VCO as a comparison result signal indicating a comparison result. The comparison circuit 51 inverts the output signal VCO when the reference signal REF and the pixel signal SIG become the same (the same voltage).

The comparison circuit 51 includes a differential input circuit 61, a voltage conversion circuit 62, and a positive feedback circuit 63. The differential input circuit 61 compares the pixel signal SIG output from the pixel circuit 100 in the pixel 11 with the reference signal REF output from the DAC 101 to output a predetermined signal (current) when the pixel signal SIG is higher than the reference signal REF. The voltage conversion circuit 62 converts the current of the signal output from the differential input circuit 61 into a voltage signal. On the basis of the signal output from the voltage conversion circuit 62, a comparison result signal that is inverted in a case where the pixel signal SIG is higher than the reference signal REF is output. The output of the positive feedback circuit 63 as the above-described output signal VCO is supplied to the data storage unit 52.

Figure 5:
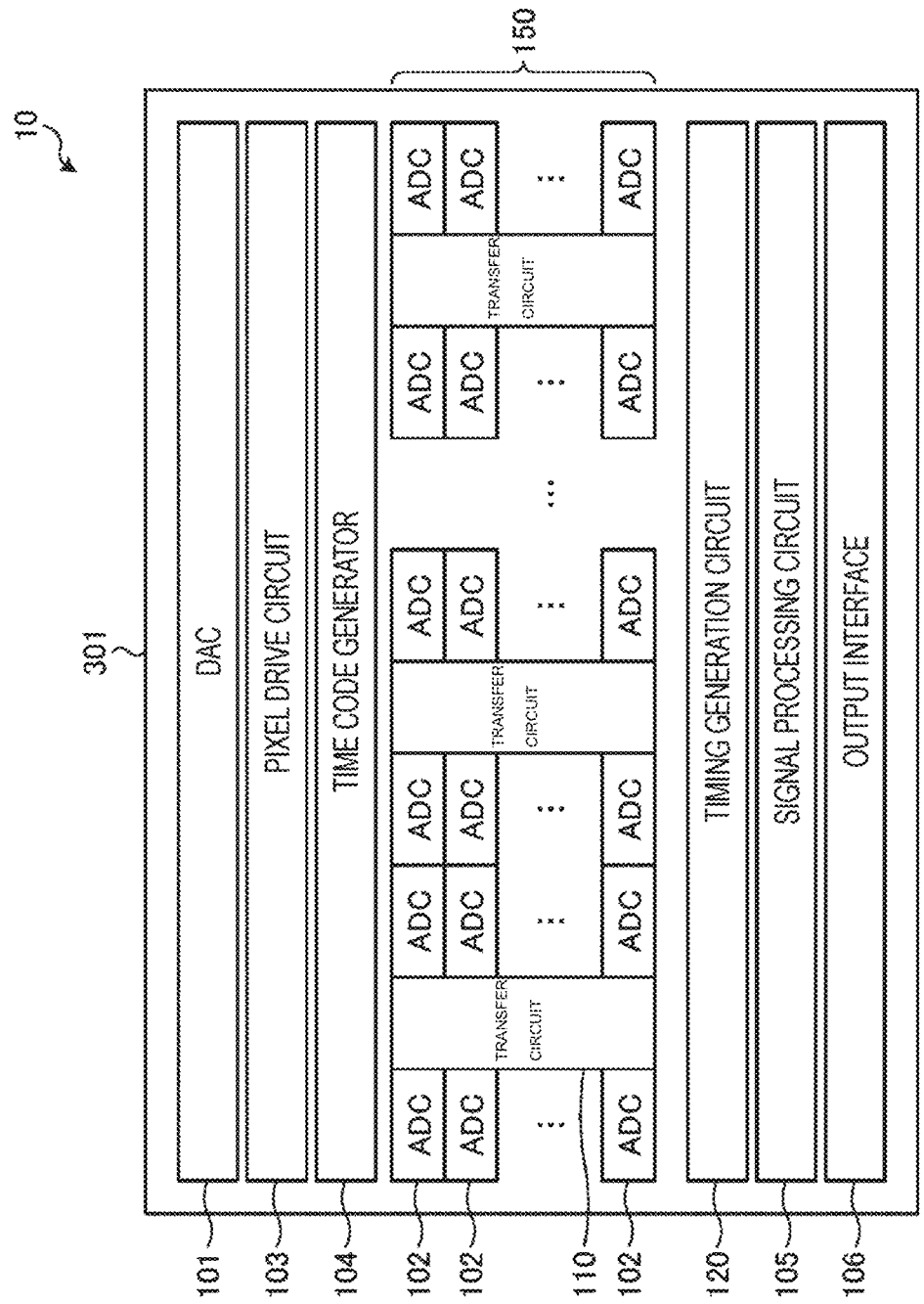
FIG. 5 is a schematic diagram illustrating a layout of an example of a solid state imaging element according to an embodiment.

In addition to the receiving the output signal VCO from the comparison circuit 51, the data storage unit 52 is supplied with a signal WR indicating a write operation of a pixel signal, a signal RD indicating a read operation of a pixel signal, and a signal WORD for controlling the read timing of the pixel 11 during the read operation of the pixel signal from a pixel drive circuit 103 described later with reference to FIG. 5. In addition, a time code generated by a time code generator 104 described later with reference to FIG. 5 is also supplied via a time code transfer unit 23.

The data storage unit 52 includes a latch control circuit 71 that controls the write operation and the read operation of the time code on the basis of the signals WR and RD, and a latch storage unit 72 that stores the time code.

In the time code write operation, while the output signal VCO in the high state is input from the comparison circuit 51, the latch control circuit 71 causes the latch storage unit 72 to store the time code supplied from the time code transfer unit 23 and updated every unit time. When the reference signal REF and the pixel signal SIG become the same (voltage) and the output signal VCO supplied from the comparison circuit 51 is inverted to a low state, the latch control circuit 71 stops writing (updating) of the supplied time code and causes the latch storage unit 72 to hold the time code finally stored in the latch storage unit 72. The time code stored in the latch storage unit 72 indicates the time when the pixel signal SIG and the reference signal REF become equal, and indicates data indicating that the pixel signal SIG was the reference voltage at that time, that is, a digitized light amount value.

After the sweep of the reference signal REF is completed and the time code is stored in the latch storage units 72 of all the pixels 11 in the pixel array, the operation of the pixels 11 is changed from the write operation to the read operation.

In the time code read operation, the latch control circuit 71 outputs the time code (digital pixel signal SIG) stored in the latch storage unit 72 to the time code transfer unit 23 when the timing of reading the pixel 11 itself comes on the basis of the signal WORD for controlling the read timing. The time code transfer unit 23 sequentially transfers the supplied time code in the column direction (vertical direction) and supplies the time code to a signal processing circuit 105 described later with reference to FIG. 5.

Note that, in the configuration of FIG. 4, in the configuration included in the pixel 11, a portion related to an analog signal, that is, the pixel circuit 100 and part of the ADC 102 (for example, part of the differential input circuit 61) are provided in the light receiving chip 300 illustrated in FIG. 3. In addition, a portion related to the digital signal included in the pixel 11, for example, the other part of the comparison circuit 51 including the other part of the differential input circuit 61, the DAC 101, and the time code transfer unit 23 are provided in the circuit chip 301 illustrated in FIG. 3.

FIG. 5 is a schematic diagram illustrating a layout of an example of the solid state imaging element 10 according to the embodiment. More specifically, FIG. 5 illustrates a layout example of the circuit chip 301 of the solid state imaging element 10. Note that, in FIG. 5 and subsequent similar drawings, the left and right direction is defined as a horizontal direction, and the up and down direction is defined as a vertical direction.

In the example of FIG. 5, in the circuit chip 301, an output interface 106, the signal processing circuit 105, and a timing generation circuit 120 are disposed toward upward from the lower end. In addition, the DAC 101, the pixel drive circuit 103, and the time code generator 104 are disposed toward downward from the upper end. A pixel array unit 150 is disposed between the timing generation circuit 120 and the time code generator 104.

The pixel array unit 150 includes a plurality of pixels 11 disposed in a matrix array. At this time, on the circuit chip 301, as described above, the portion of the ADC 102 in the pixel 11, for example, the portion excluding part of the differential input circuit 61 disposed on the light receiving chip 300 is disposed. Therefore, in FIG. 5, a configuration of the ADC 102 of FIG. 4 excluding part of the differential input circuit 61 disposed on the light receiving chip 300 is illustrated as an ADC 102. This also applies to the following similar drawings.

A plurality of transfer circuits 110 is disposed at predetermined intervals in the horizontal direction from the upper end side (first side) toward the lower end side (second side) of the pixel array unit 150 for the pixel array unit 150. That is, in the pixel array unit 150, assuming that the arrangement of the ADCs 102 (pixels 11) in the horizontal direction is a row and the arrangement of the ADCs (pixels 11) in the vertical direction is a column, each transfer circuit 110 is disposed along the column direction in the pixel array unit 150.

In the example of FIG. 5, each transfer circuit 110 has a configuration in which one ADC 102 is connected to each of the left side and the right side of the transfer circuit 110 in each row. That is, in the example of FIG. 5, in the pixel array unit 150, the number of transfer circuits 110 is equal to "(the number of pixels in the row direction)/2".

Each transfer circuit 110 includes the time code transfer unit 23 described above. In addition, each transfer circuit 110 also serves as a path through which the image data output from each pixel 11 of the pixel array unit 150 is transferred to the signal processing circuit 105.

In addition, the pixel array unit 150 according to the embodiment has an extremely horizontally elongated shape in which there are several thousand of pixels in the row direction and several tens of pixels in the column direction, for example. That is, the pixel array unit 150 has an extremely large aspect ratio of size.

Note that, in the example of FIG. 5 and the subsequent similar drawings, each transfer circuit 110 is illustrated to be disposed between the two ADCs 102, but this is for description. In practice, the ADCs 102 (pixels 11) are disposed in a lattice pattern at equal intervals, and the transfer circuits 110 are disposed in a layer different from that of the ADCs 102. That is, each transfer circuit 110 is disposed with a portion overlapping with each ADC 102 (pixel 11) in the layer direction in the laminated structure.

2. Configuration According to Embodiment

Figure 6:
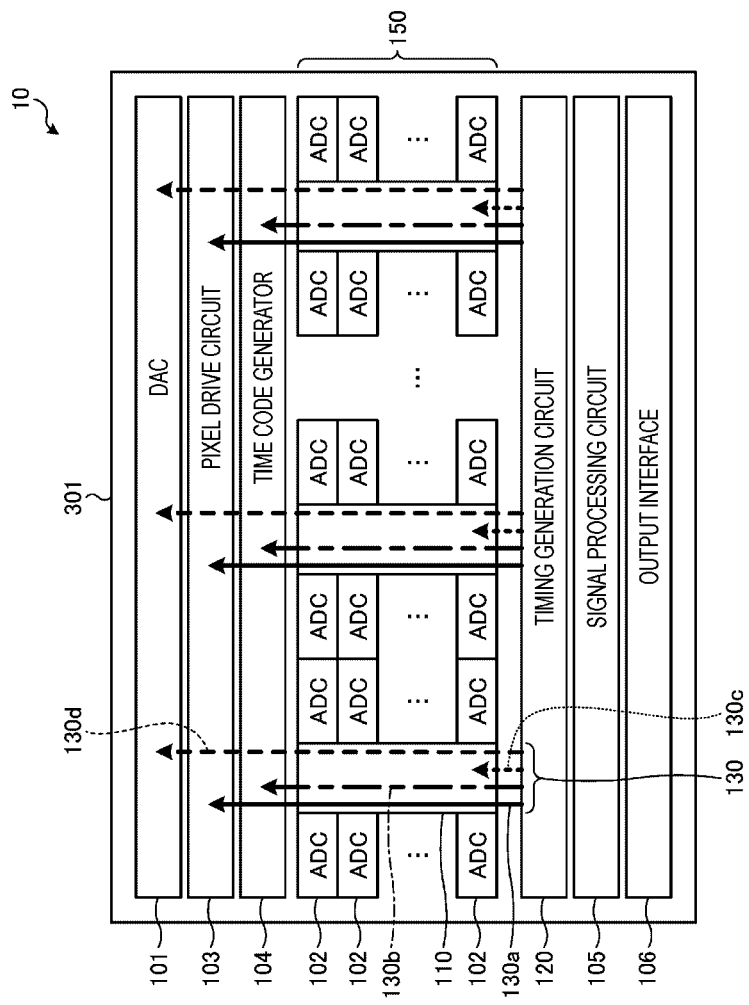
FIG. 6 is a schematic diagram illustrating a configuration of an example of a solid state imaging element according to an embodiment.

Next, a configuration according to an embodiment of the present disclosure will be described. FIG. 6 is a schematic diagram illustrating a configuration of an example of the solid state imaging element 10 according to the embodiment. As illustrated in FIG. 6, in the embodiment, the control lines 130 are disposed in each transfer circuit 110, and the timing generation circuit 120 and the configuration, of the pixel array unit 150, disposed away from the timing generation circuit 120 are connected through each control line 130. The timing generation circuit 120 generates various timing signals for driving the solid state imaging element 10. The timing generation circuit 120 has a function as a timing signal generation unit that generates a timing signal that controls at least timing at which the time code generator 104 generates a time code.

More specifically, the control line 130 includes a plurality of control lines 130a, 130b, 130c, and 130d. The timing generation circuit 120 can output different timing signals to the control lines 130a, 130b, 130c, and 130d.

In the example of FIG. 6, the control line 130a is a control line for supplying a timing signal generated by the timing generation circuit 120 to the pixel drive circuit 103. The pixel drive circuit 103 generates a drive signal (for example, the signal OFG, the signal TRG, and the signal RST described above) for driving each pixel 11 in the pixel circuit 100 on the basis of the timing signal supplied via the control line 130a. The pixel drive circuit 103 supplies the generated drive signals to respective pixels 11 via the transfer circuit 110.

The control line 130b is a control line for supplying a timing signal generated by the timing generation circuit 120 to the time code generator 104. The time code generator 104 generates a time code whose value is updated every unit time on the basis of the timing signal supplied via the control line 130b. The time code generator 104 supplies the generated time code to each pixel 11 via the transfer circuit 110.

The control line 130c is a control line for supplying the timing signal generated by the timing generation circuit 120 to each ADC 102. The timing signal includes, for example, the signal WR, the signal RD, and the signal WORD described above, and the ADC 102 is driven by this timing signal.

In addition, the control line 130d is a control line for supplying the timing signal generated by the timing generation circuit 120 to the DAC 101. The DAC 101 starts, for example, sweeping of the reference signal REF according to the timing signal.

In the embodiment, the timing generation circuit 120 is configured to be able to suppress a delay between the transfer circuits 110 in each timing signal output to each of the control lines 130a, 130b, 130c, and 130d disposed in each of the transfer circuits 110.

Note that, hereinafter, in a case where it is not necessary to particularly distinguish the control lines 130a, 130b, 130c, and 130d, these control lines 130a, 130b, 130c, and 130d will be collectively described as a control line 130.

2-1. Timing Generation Circuit

Next, the timing generation circuit 120 according to the embodiment will be described in more detail.

Figure 7:
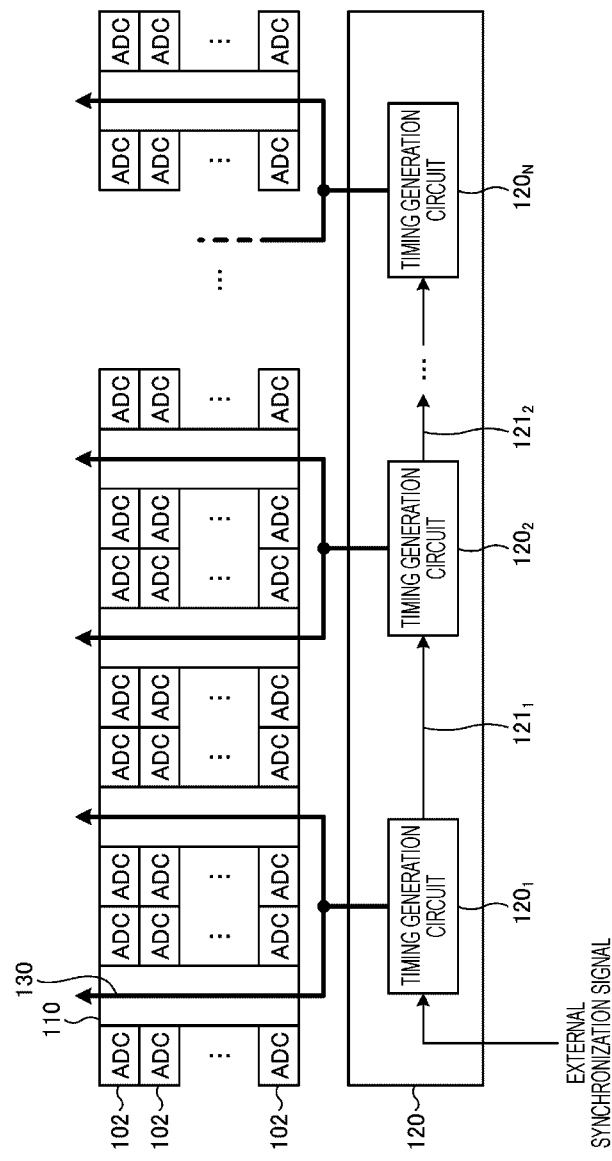
FIG. 7 is a block diagram more specifically illustrating a configuration of an example of a timing generation circuit according to an embodiment.

FIG. 7 is a block diagram more specifically illustrating a configuration of an example of the timing generation circuit 120 according to the embodiment. In FIG. 7, the timing generation circuit 120 includes a plurality of timing generation circuits $120_1$, $120_2$, ..., $120_N$. In the example of FIG. 7, each of the timing generation circuits $120_1$, $120_2$, ..., and $120_N$ supplies a timing signal to each control line 130 of the two transfer circuits 110 in common. In a case where the influence of the delay between the control lines 130 on the characteristics can be ignored, the timing signal can be supplied from one timing generation circuit $120_1$ to the plurality of control lines 130 in this manner.

Here, as illustrated in FIG. 7, a case where an external synchronization signal serving as a reference of a timing signal is input from, for example, a timing generation circuit $120_1$ at the end among the plurality of timing generation circuits $120_1$, $120_2$, ..., $120_N$ will be considered.

The timing generation circuit $120_1$ generates a timing signal on the basis of the input external synchronization signal to output the timing signal to the control line 130 and transmits a synchronization signal $121_1$ based on the external synchronization signal to a next-stage timing generation circuit $120_2$. The timing generation circuit $120_2$ generates a timing signal on the basis of the input synchronization signal $121_1$ to output the timing signal to the control line 130 and transmits the synchronization signal $121_1$ as a synchronization signal $121_2$ to a next timing generation circuit. In this manner, the synchronization signals $121_1$, $121_2$, ... based on the external synchronization signal are sequentially transmitted to the next timing generation circuit.

In this case, for example, the synchronization signal $121_1$ transmitted from the timing generation circuit $120_1$ at the left end to the timing generation circuit $120_2$ and the synchronization signal transmitted to the timing generation circuit $120_N$ at the right end in FIG. 7 are out of synchronization due to the influence of the delay.

When the supplied synchronization signals in the respective timing generation circuits $120_1$, $120_2$, ..., and $120_N$ is out of synchronization, a perspective difference occurs to the timing of the timing signal propagated by each of the control lines 130 connected to the respective timing generation circuits $120_1$, $120_2$, ..., and $120_N$ according to the synchronization offset, and this perspective difference leads to shading of the captured image.

Therefore, in the embodiment, each of the timing generation circuits $120_1$, $120_2$, ... gives a predetermined delay to the respective timing signals generated on the basis of the input synchronization signals $121_1$, $121_2$, ...

Figure 8:
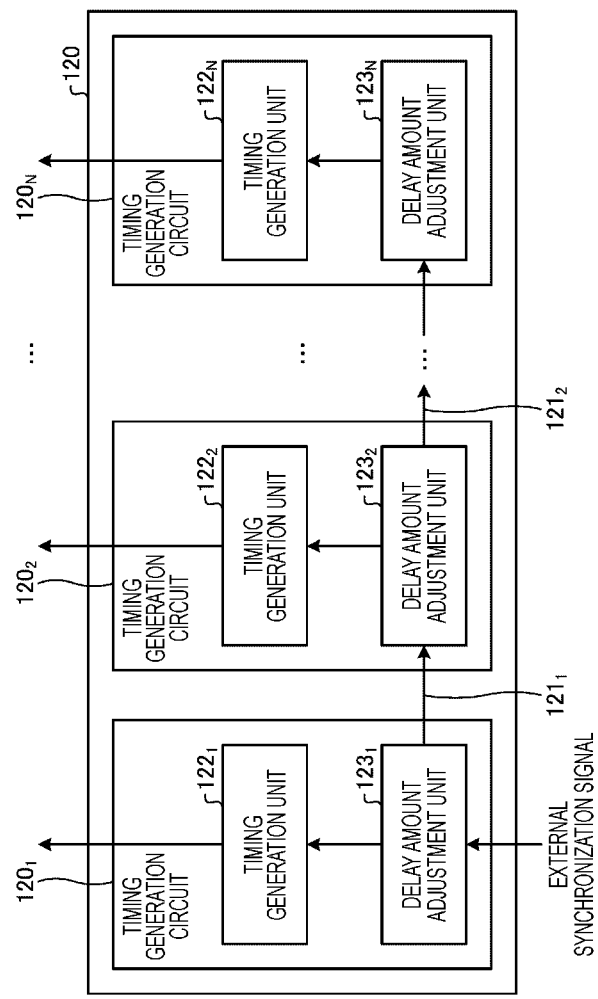
FIG. 8 is a block diagram illustrating a configuration of an example of a timing generation circuit including a delay amount adjustment unit that adjusts a delay according to an embodiment.

FIG. 8 is a block diagram illustrating a configuration of an example of a timing generation circuit including a delay amount adjustment unit that adjusts a delay according to the embodiment. In FIG. 8, the timing generation circuit $120_1$ includes a timing generation unit $122_1$ and a delay amount adjustment unit $123_1$. Similarly, the timing generation circuits $120_2$, ..., and $120_N$ includes timing generation units $122_2$, ..., and $122_N$ and delay amount adjustment units $123_2$, ..., and $123_N$, respectively.

Here, it is assumed that an external synchronization signal is input to the delay amount adjustment unit $123_1$ in the timing generation circuit $120_1$ disposed at the left end. In this case, simply considering the distance in the horizontal direction, the delay of the timing generation circuit $120_1$ at the left end to which the external synchronization signal is input is substantially 0, while the delay of the timing generation circuit $120_N$ disposed at the right end far from the input position of the external synchronization signal is maximized. Therefore, the delay amount given to each of the timing generation circuits $120_1$, $120_2$, . . . , $120_N$ is maximized in the timing generation circuit $120_1$ at the left end to which the external synchronization signal serving as a reference is supplied, and is minimized in the timing generation circuit $120_N$ at the right end farthest from the position to which the external synchronization signal is supplied.

In the example of FIG. 8, the external synchronization signal is supplied to the timing generation circuit $120_1$ at the left end and input to the delay amount adjustment unit $123_1$. The delay amount adjustment unit $123_1$ supplies a synchronization signal based on the input external synchronization signal to the next-stage timing generation circuit $120_2$, and supplies a synchronization signal delayed by imparting a predetermined delay amount to the external synchronization signal to the timing generation unit $122_1$. Here, the delay amount imparted by the delay amount adjustment unit $123_1$ is the maximum delay amount among the delay amounts imparted in the respective timing generation circuits $120_1$, $120_2$, . . . , and $120_N$ included in the timing generation circuit 120.

The timing generation unit $122_1$ generates a timing signal on the basis of the synchronization signal to which the delay amount is imparted by the delay amount adjustment unit $123_1$ to output the timing signal to the control line 130.

In the timing generation circuit $120_2$, the delay amount adjustment unit $123_2$ further supplies the input synchronization signal $121_1$ as a synchronization signal $121_2$ to a next-stage timing generation circuit (not illustrated), and supplies a synchronization signal delayed by imparting a predetermined delay amount to the synchronization signal $121_1$ to the timing generation unit $122_2$. Here, the timing generation circuit $120_2$ is farther from the position to which the external synchronization signal is supplied than the timing generation circuit $120_1$. Therefore, the delay amount imparted by the delay amount adjustment unit $123_2$ in the timing generation circuit $120_2$ is smaller than the delay amount imparted by the delay amount adjustment unit $123_1$ in the preceding timing generation circuit $120_1$.

Furthermore, the delay amount imparted by the delay amount adjustment unit $123_N$ in the timing generation circuit $120_N$ farthest from the position where the external synchronization signal is supplied is the smallest among the timing generation circuits $120_1$, $120_2$, . . . , and $120_N$.

As described above, in each of the timing generation circuits $120_1$, $120_2$, . . . , and $120_N$, the delay amount according to the distance from the position where the external synchronization signal is supplied is imparted to the timing signal to be output, whereby the delay amount of the timing signal output from each of the timing generation circuits $120_1$, $120_2$, . . . , and $120_N$ is uniformized. As a result, the occurrence of the perspective difference due to the synchronization offset is suppressed, and the occurrence of shading in the captured image can be prevented.

2-2. Transfer Circuit

Next, a transfer circuit 110 according to the embodiment will be described in more detail.

Figure 9:
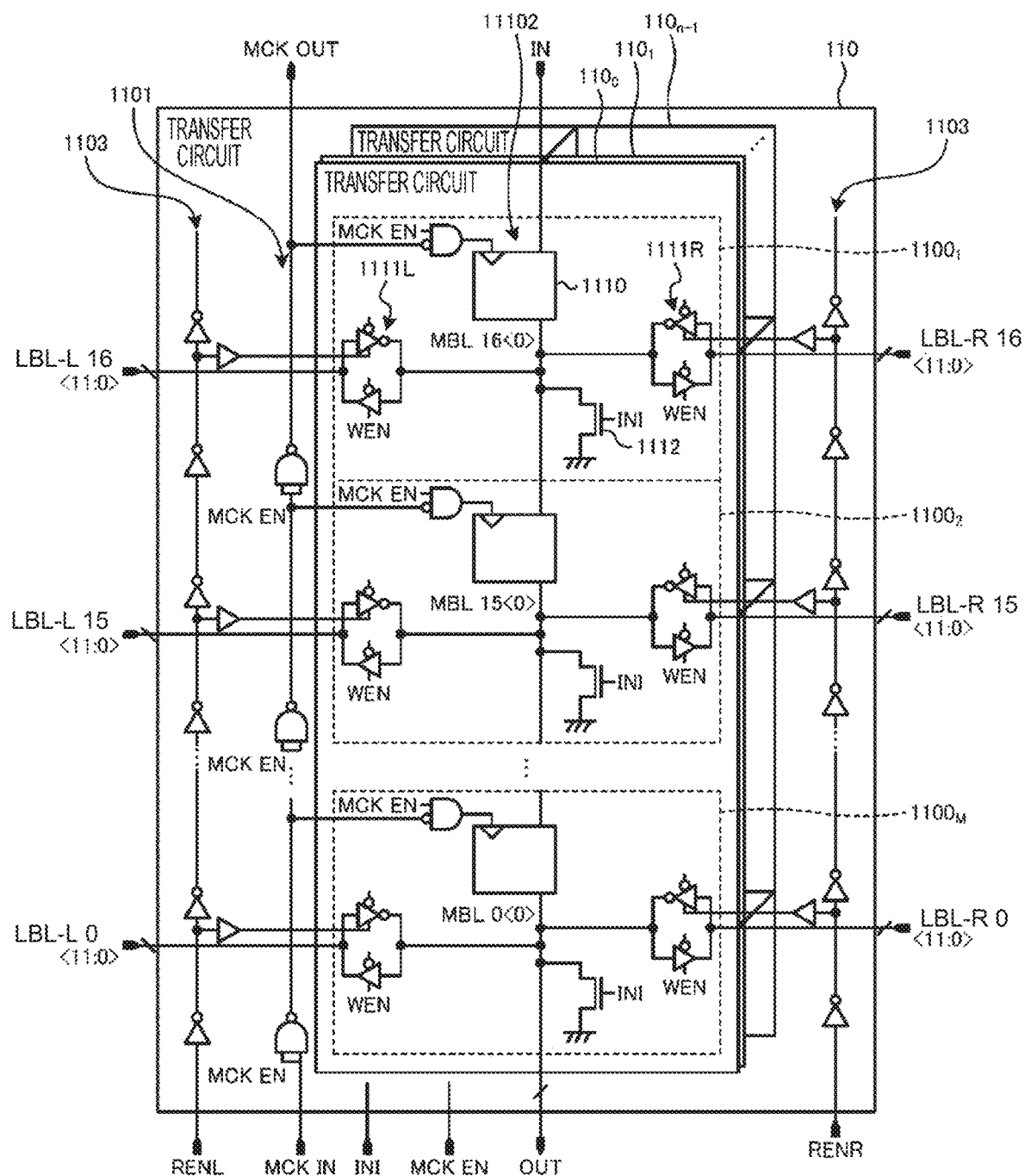
FIG. 9 is a circuit diagram illustrating a configuration of an example of a transfer circuit applicable to an embodiment.

FIG. 9 is a circuit diagram illustrating a configuration of an example of the transfer circuit 110 applicable to the embodiment. The transfer circuit 110 applicable to the embodiment is a shift register having a D-FF (flip-flop) 1110 as a core, and includes an MCK clock transfer unit 1101, an FF data transfer unit 1102, and a read enable (REN) signal transfer unit 1103. The REN signal transfer unit 1103 is provided at each of the left and right sides of the transfer circuit 110 in order to transfer the left side read enable signal RENL and the right side read enable signal RENR in the figure.

In each of the circuit blocks $1100_1$, $1100_2$, . . . , and $1100_M$ of one stage of the D-FF 1110, read/write bidirectional buffers 1111L and 1111R (hereinafter, the bidirectional buffers 1111L and 1111R) are provided at the left side and the right side of an FF output stage data line (hereinafter, MBL) connected to an output of the D-FF 1110, and an n-metal oxide semiconductor (nMOS) transistor 1112 for transfer circuit initialize (REPINI) for initializing and low-level fixing the MBL is connected to the line.

In addition, in the example of FIG. 9, the transfer circuit 110 includes bit-by-bit transfer circuits $110_1$, $110_2$, . . . , $110_{n-1}$, and includes M circuit blocks $1100_1$, $1100_2$, . . . , $1100_M$ through bits. In each pixel 11 included in the pixel array unit 150, pixel reading access is controlled for each of the circuit blocks $1100_1$ to $1100_M$ in a unit called a cluster including a predetermined number of pixels 11.

The signal MCK is an operation clock signal of the D-FF 1110. The D-FF 1110 is disposed for each bit line of the circuit block $1100_1$, that is, in each of the transfer circuits $110_1$, $110_2$, . . . , $110_{n-1}$ for each bit. The bidirectional buffers 1111L and 1111R are controlled by a write enable signal WEN and a readout enable signal REN, thereby operating as a buffer when writing is performed from the MBL to the local bit line (hereinafter, LBL) or a buffer when reading is performed from the LBL to the MBL in each of the circuit blocks $1100_1$ to $1100_M$.

The signal WEN is fixed to a high level in a case where the transfer circuit 110 is used as a transfer circuit for writing, and is fixed to a low level in a case where the transfer circuit is used as a transfer circuit for reading. With this circuit configuration, the transfer circuit 110 can be used as the transfer circuit for writing and the transfer circuit for reading in common.

By providing the LBL-L and the LBL-R and the bidirectional buffers 1111L and 1111R at the left side and the right side of the MBL, the signal transition of the data reading by the signal WORD can be concealed at the timing of operating the D-FF 1110. Accordingly, the read enable signal REN as the read enable signals REN-L and REN-R is also input to the left side and the right side of the MBL.

FIG. 10A is a schematic diagram illustrating an example of access to the pixel array unit 150 by the transfer circuit 110 applicable to the embodiment. The pixel array unit 150 is divided into units called clusters 140 each including a predetermined number of pixels 11, and the circuit blocks $1100_1$, $1100_2$, . . . , $1100_M$ of the transfer circuit 110 is associated with the respective clusters 140 on a one-to-one basis.

For example, as illustrated on the right side of FIG. 10A, it is assumed that the cluster 140 includes 64 pixels of 4 horizontal pixels×16 vertical pixels, and the transfer circuit 110 is disposed along the central portion 110' in the row direction of the cluster 140. In one circuit block of the transfer circuit 110 (for example, the circuit block $1100_1$ for the 64 pixels, for example, the pixels 11 are designated in the order of the number indicated in each pixel 11 in the figure with respect to the pixels 11 at the left side and the right side of the central portion 110' and transferring (writing) the time code and transferring (reading) the pixel data are performed.

Note that, in FIG. 10A, for the sake of explanation, the transfer circuit 110 is disposed for the column of the clusters 140 at the right end of the pixel array unit 150, but practically, the transfer circuit 110 is disposed for each column of the clusters 140 included in the pixel array unit 150.

Figure 10B:
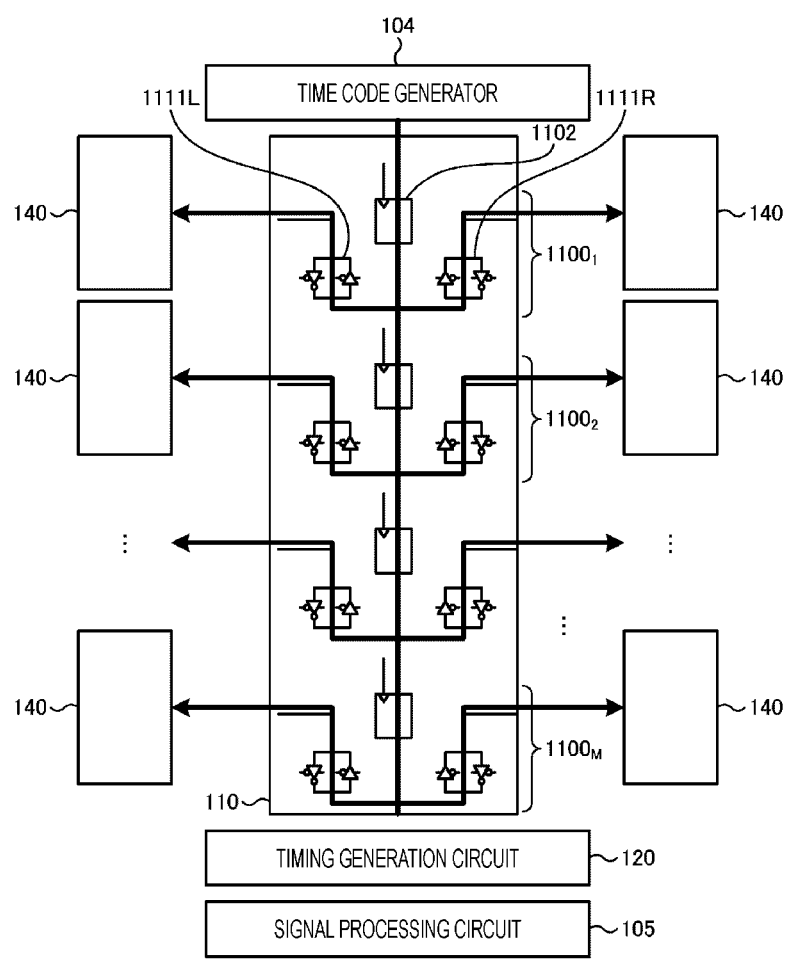
FIG. 10B is a schematic diagram illustrating a state of writing a time code.

FIG. 10B is a schematic diagram illustrating how time codes are written. The time code generated by the time code generator 104 is propagated to each pixel 11 of the corresponding cluster 140 via the shift registers including the respective circuit blocks $1100_1, 1100_2, \ldots, 1100_M$.

Figure 11A:
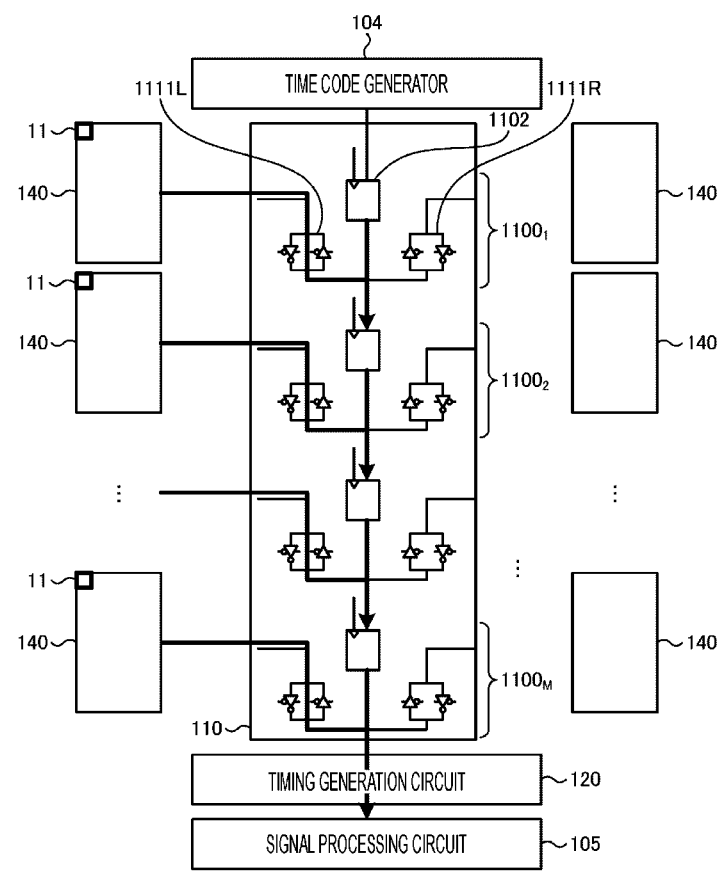
FIG. 11A is a schematic diagram illustrating a state of reading a time code.
Figure 11B:
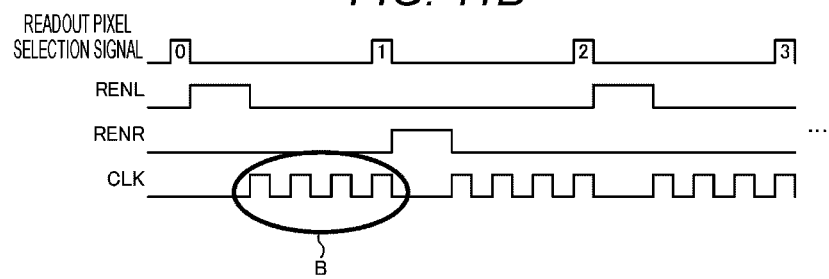
FIG. 11B is a timing chart of an example illustrating timing related to reading of a time code.

FIG. 11A is a schematic diagram illustrating how time codes are read. FIG. 11B is a timing chart of an example illustrating timing related to reading of a time code. A readout pixel to be read is selected from the pixels 11 included in the cluster 140 by a predetermined readout pixel selection signal, and the time code, of the selected readout pixel, stored in the latch storage unit 72 is read and transferred to the signal processing circuit 105.

For example, in a case where the pixel 11 with the number "0" is designated by the readout pixel selection signal, since the pixel 11 with the number "0" is a left side pixel of the cluster 140, the transfer circuit 110 is caused to perform the shift register operation by setting the left side readout enable signal RENL to the high state and striking the clock MCK by 4 clocks as indicated by a frame B in FIG. 11B, for example. The time code read from the pixel 11 with the number "0" is passed to the MBL via the bidirectional buffer 1111L and transferred to the signal processing circuit 105.

The same applies to a case where the pixel 11 with the number "1" is designated by the readout pixel selection signal. Since the pixel 11 with the number "1" is a right side pixel of the cluster 140, the transfer circuit 110 is caused to perform the shift register operation by setting the right side readout enable signal RENR to the high state and striking the clock MCK by, for example, 4 clocks. The time code read from the pixel 11 with the number "1" is passed to the MBL via the bidirectional buffer 1111R and transferred to the signal processing circuit 105.

Figure 12:
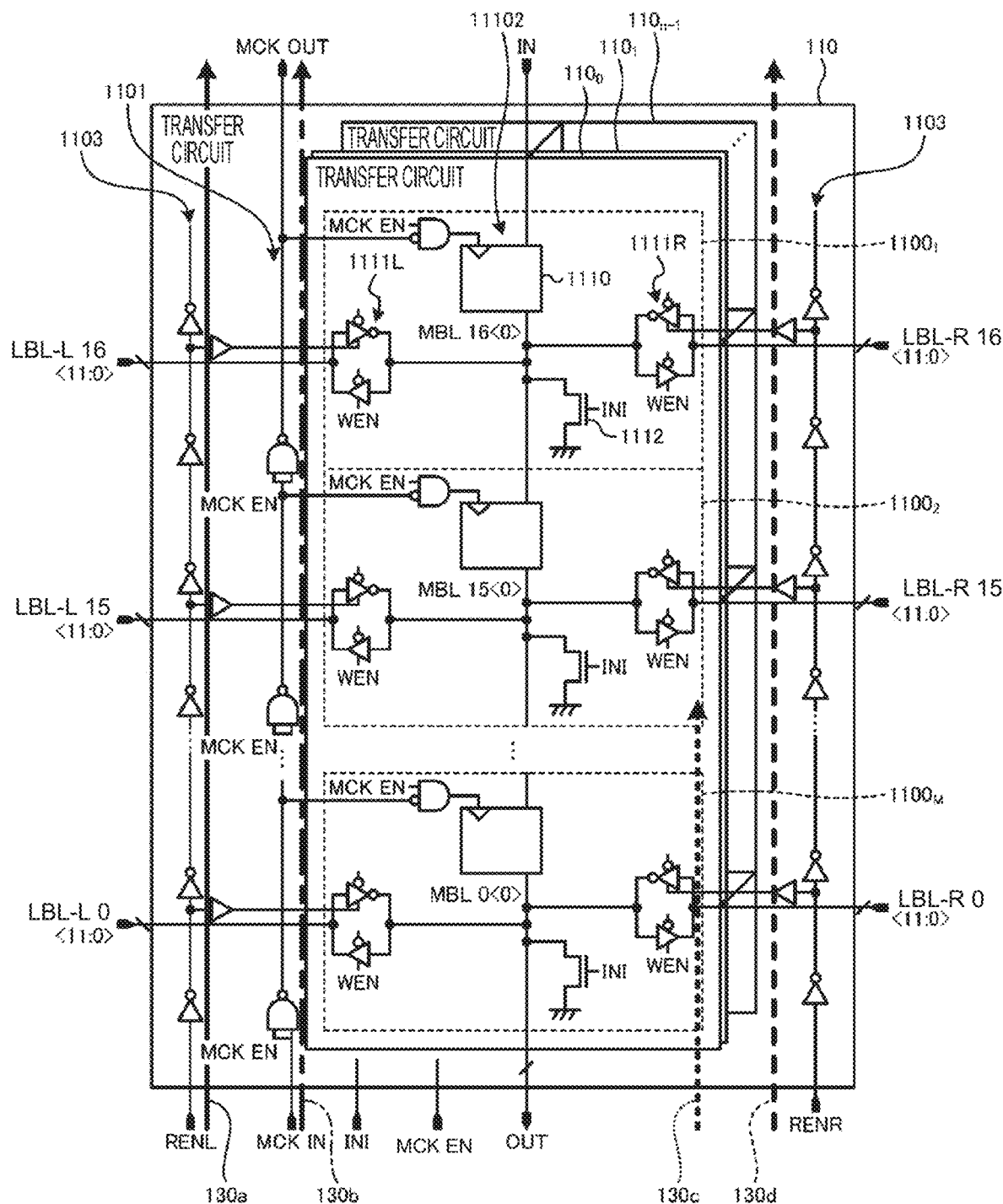
FIG. 12 is a schematic diagram illustrating an example of a layout of each control line according to the embodiment.

The embodiment has a layout in which each of the control lines 130a to 130d is disposed in the transfer circuit 110 that performs such an operation. FIG. 12 is a schematic diagram illustrating an example of a layout of each of the control lines 130a to 130d according to the embodiment. In the example of FIG. 12, the control line 130a is disposed inside the left side REN signal transfer unit 1103 in the figure, and the control line 130b is disposed inside the MCK clock transfer unit 1101. In addition, the control line 130d is disposed inside the right side REN signal transfer unit 1103 in the figure. Furthermore, the control line 130c is disposed further inside the control line 130d.

Among the control lines 130a to 130d, the control lines 130a, 130b, and 130d pass through the transfer circuit 110 in order to supply the timing signal generated by the timing generation circuit 120 to the pixel drive circuit 103, the time code generator 104, and the DAC 101, respectively, disposed outside the pixel array unit 150. On the other hand, the control line 130c for supplying the timing signal to each ADC 102 branches left and right in the region of the transfer circuit 110, for example.

2-3. Shield Structure

Next, a shield structure for the control line 130 according to the embodiment will be described. In a case where the control line 130 is disposed in the transfer circuit 110, that is, having a portion overlapping with the transfer circuit 110 in the layer direction of lamination, it is necessary to consider interference between a digital signal transmitted through the control line 130 and an analog signal handled in the pixel circuit 100 or the differential input circuit 61. In the embodiment, the control line 130 disposed in the transfer circuit 110 is shielded using low-resistance wiring (for example, power supply wiring). As a result, it is possible to suppress interference of the digital signal transmitted through the control line 130 with an analog signal such as an output of the pixel circuit 100 or the differential input circuit 61.

Figure 13A:
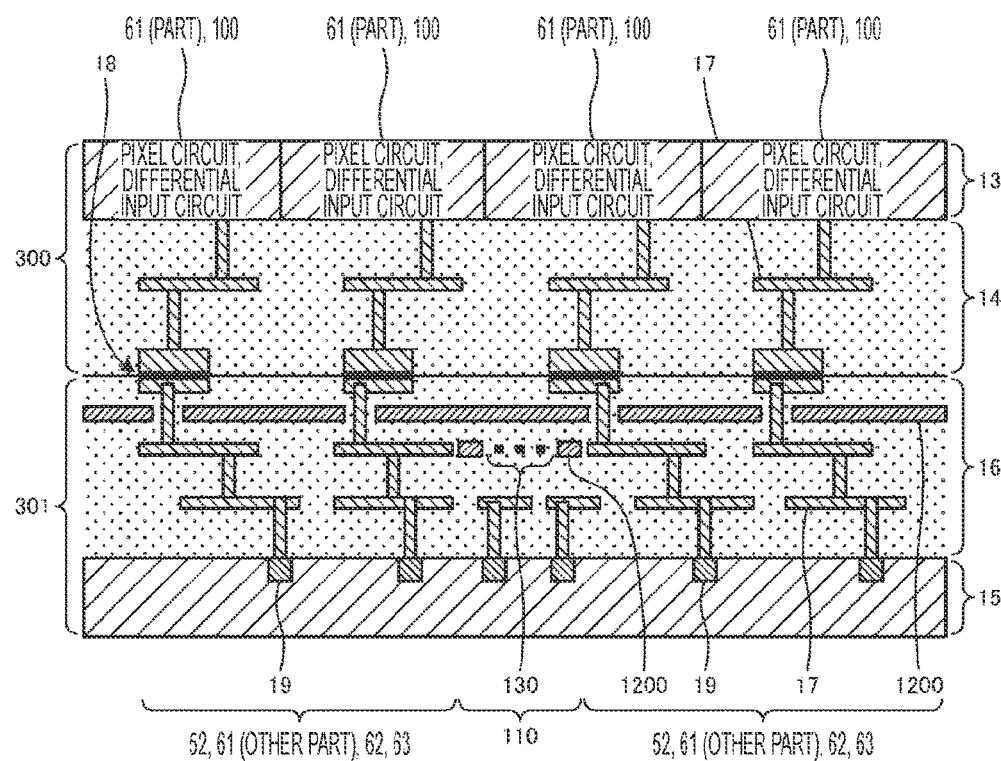
FIGS. 13A and 13B are schematic diagrams illustrating an example of a shield for a control line 130 disposed in a transfer circuit 110 according to the embodiment.
Figure 13B:
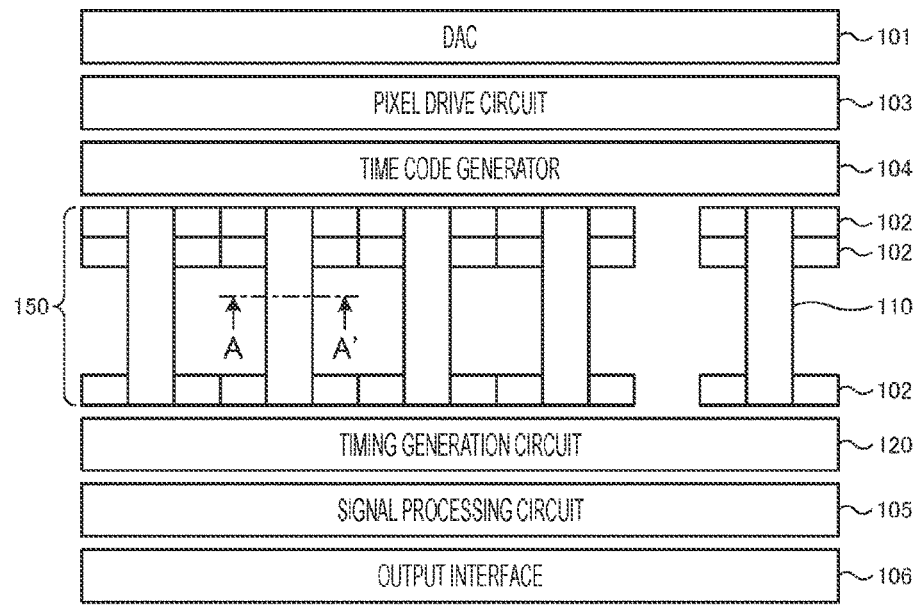

FIGS. 13A and 13B are schematic diagrams illustrating an example of a shield for the control line 130 disposed in the transfer circuit 110 according to the embodiment. FIG. 13A is an example of a cross-sectional view taken along line A-A' illustrated in in FIG. 13B.

The light receiving chip 300 includes a first substrate 13 and a wiring layer 14 provided on the first substrate 13. In the light receiving chip 300, the pixel circuit 100 and part of the differential input circuit 61 in the ADC 102 are disposed on the first substrate 13. Each wiring 17 is provided in the wiring layer 14.

As in the light receiving chip 300, the circuit chip 301 includes a second substrate 15 and a wiring layer 16 provided on the second substrate. In the circuit chip 301, respective elements 19 is provided on the second substrate 15, and the other part of the differential input circuit 61 in the ADC 102, the data storage unit 52, the voltage conversion circuit 62, and the positive feedback circuit 63 are disposed. In the wiring layer 16, each wiring 17 is provided, and the control line 130 is provided.

The light receiving chip 300 and the circuit chip 301 are bonded to each other by the surface of the wiring layer 14 and the surface of the wiring layer 16. More specifically, the light receiving chip 300 and the circuit chip 301 are bonded to each other with a face, of the wiring layer 14, opposite to the first substrate 13 and a face, of the wiring layer 16, opposite to the second substrate 15 as bonding faces, thereby forming the solid state imaging element 10.

At this time, the light receiving chip 300 and the circuit chip 301 are electrically connected via a bonding portion 18 by Cu—Cu bonding or the like through wiring 17 in the wiring layers 14 and 16.

Here, in the solid state imaging element 10 according to the embodiment, a shield 1200 is provided between the control line 130 and the bonding face in the circuit chip 301. As described above, the shield 1200 is configured using low-resistance wiring such as power supply wiring, and a predetermined potential is applied. The shield 1200 between the control line 130 and the bonding face can suppress interference of the digital signal transmitted to the control line 130 with the analog signal in the light receiving chip 300.

In addition, the shield 1200 between the control line 130 and the bonding face also functions as a light shielding film that shields light emission from the second substrate 15 in the circuit chip 301.

Furthermore, in the example of FIGS. 13A and 13B, the shields 1200 are also provided at both sides of the control line 130. As a result, interference of the digital signal transmitted to the control line 130 with each wiring 17 in the circuit chip 301 can be suppressed.

2-4. Effects According to Embodiment

Next, effects of the configuration according to the embodiment will be described with reference to FIGS. 14A and 14B. As an example, it is illustrated how much the delay of the pixel control signal can be suppressed by passing the control line 130 through the transfer circuit 110.

Figure 14B:
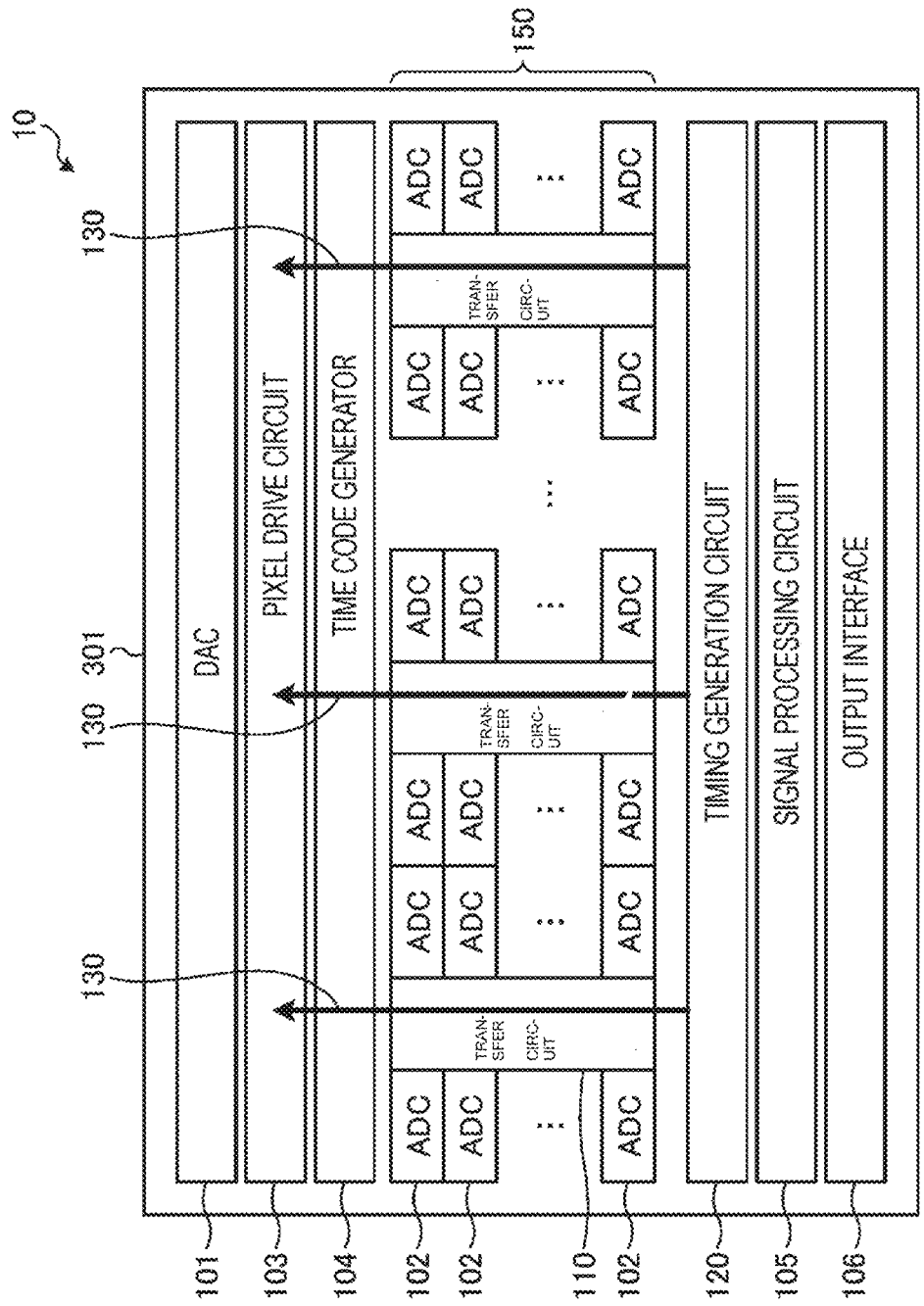
FIG. 14B is a diagram illustrating an example of a layout of the solid state imaging element according to an embodiment.

As a premise, with reference to FIG. 14B, the length of the pixel region in the horizontal direction of the pixel array unit 150 is set to 10 [cm], and the length in the vertical direction is set to 500 [μm]. In addition, the vertical length of the time code generator 104 is set to 200 [μm], the vertical length of the transfer circuit 110 is set to 300 [μm], and the delay time per 1 [cm] is set to the delay time ΔT.

FIG. 14A illustrates an example of a layout of the solid state imaging element 10 according to the existing technology. In the example of FIG. 14A, timing generation circuits 120a and 120b are disposed at the left side and the right side of the pixel array unit 150, that is, at both ends in the horizontal direction, respectively, and timing signals are output to respective control lines 132a and 132b, of the pixel array unit 150, disposed in parallel in the horizontal direction.

As described above, in the existing technology, since the control lines 132a and 132b are wired from the two left and right timing generation circuits 120a and 120b, respectively, the left timing generation circuit 120a controls the left half of the pixel array unit 150, and the right timing generation circuit 120b controls the right half of the pixel array unit 150. That is, the delay time difference between the left and the right is "5×ΔT" because the delay time per 1 [cm] is the delay time ΔT. This delay time difference corresponds to shading. In addition, since the timing signal is transmitted along the long side of the pixel array unit 150 having a very large aspect ratio of size, it is difficult to realize a high frame rate due to a large delay time itself.

FIG. 14B illustrates an example of a layout of the solid state imaging element 10 according to the embodiment. In the embodiment, since the length of the control line 130 from the timing generation circuit 120 to the pixel drive circuit 103 is the sum of the lengths of the transfer circuit 110 and the time code generator 104 in the vertical direction, 300 [μm]+200 [μm]=500 [μm] is obtained. This distance does not vary depending on the position in the pixel array unit 150, and a perspective difference in the timing signal transmitted through the control line 130 does not occur. In addition, the delay time of the timing signal is (500 [μm]/1 [cm])×ΔT=0.05×ΔT, which is 1/100 as compared with the example of the existing technology. As a result, a high-speed response is possible, and a high frame rate can be realized.

In addition, in the existing technology, the longer the length in the horizontal direction is, the longer the control lines 132a and 132b is, and the longer the delay time is. On the other hand, in the configuration of the embodiment, the length of the control line 130 is the sum of the lengths of the transfer circuit 110 and the time code generator 104 described above in the vertical direction, and is constant. That is, the longer the length in the horizontal direction, the greater the effect of improving the delay time relative to the existing technology.

3. First Modification of Embodiment

Next, a first modification of the embodiment will be described. The first modification of the embodiment is an example in which the configuration of the control line 130 disposed for the transfer circuit 110 or the timing signal transmitted by the control line 130 is made different according to the function of the supply destination to which each of the control lines 130a to 130d included in the control line 130 supplies the timing signal.

Hereinafter, a case where the configuration of the control line 130 disposed for the transfer circuit 110 is made different will be described.

Figure 15:
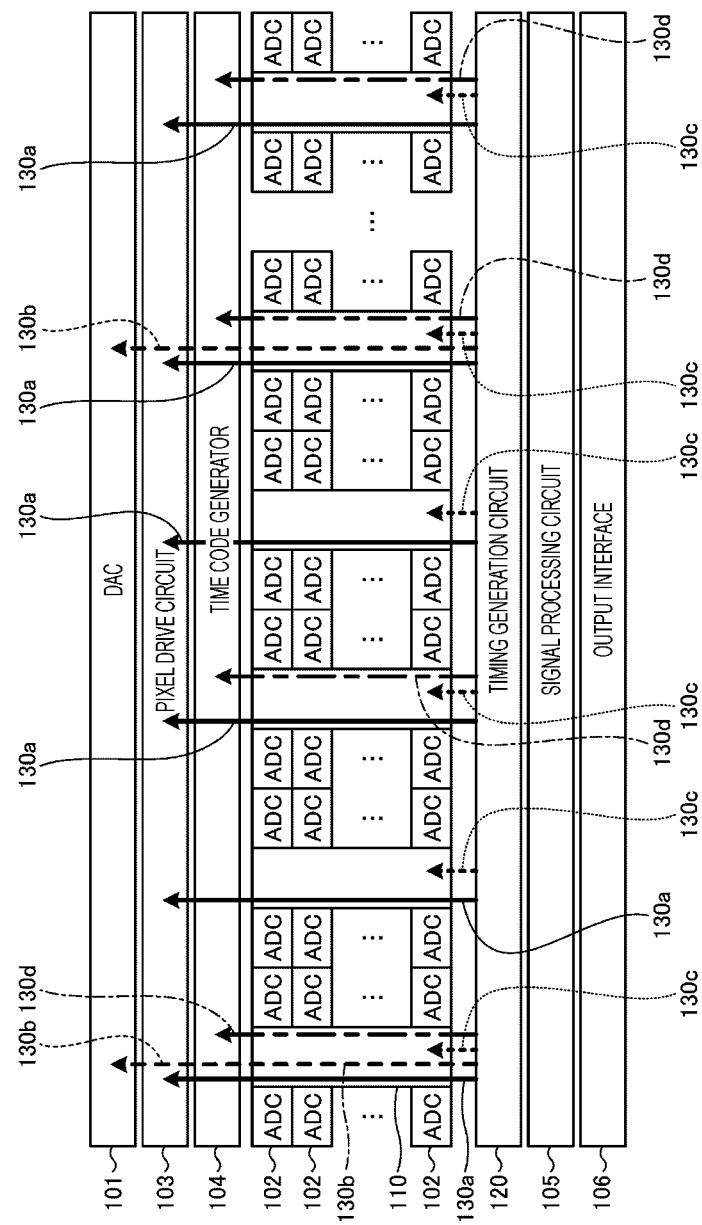
FIG. 15 is a schematic diagram illustrating a configuration of an example of a solid state imaging element according to a first modification of the embodiment.

FIG. 15 is a schematic diagram illustrating a configuration of an example of the solid state imaging element 10 according to the first modification of the embodiment. For example, the pixel drive circuit 103 is provided for each column. In addition, the ADC 102 is provided for each pixel 11. Therefore, since the pixel drive circuit 103 and the ADC 102 need to operate at a high speed, the control line 130a that supplies a timing signal to the pixel drive circuit 103 and the control line 130c that supplies a timing signal to each ADC 102 are disposed in all the transfer circuits 110.

On the other hand, the time code generator 104 is not required to operate at a high speed as compared with the pixel drive circuit 103 and each ADC 102. Therefore, the time code generator 104 can be provided every multiple columns, for example. In the example of FIG. 15, the control lines 130d that supply the timing signals to the time code generator 104 are disposed in the transfer circuit 110 every other transfer circuit 110 by thinning out the transfer circuits 110 every other.

For example, one or two DACs 101 are only required to be provided for the pixel array unit 150. In a case where only one DAC 101 is provided, one reference signal REF is used in common for all the pixels 11 of the pixel array unit 150. In a case where two DACs 101 are provided, the reference signals REF generated by the two DACs 101 may be merged, or the regions may be divided in the pixel array unit 150, and the reference signals REF generated by the two DACs 101 may be supplied to the respective regions.

As described above, the DAC 101 is not required to operate at a high speed. FIG. 15 illustrates an example in a case where two DACs 101 are provided for the pixel array unit 150, and the control lines 130b that supply the timing signals to the DACs 101 are disposed in the transfer circuits 110 every four transfer circuits 110 by thinning out the transfer circuits 110 in triplicate.

As described above, by making the configuration of the control line 130 disposed for the transfer circuit 110 different, it is possible to expect effects such as reduction of power consumption and suppression of generation of noise due to the timing signal transmitted through the control line 130.

4. Second Modification of Embodiment

Next, a second modification of the embodiment will be described. The second modification of the embodiment has a unit configuration in which the pixel region of the pixel array unit 150 is divided and a timing signal is transmitted for each divided region. In other words, the unit is a divided pixel array unit obtained by dividing the pixel region of the pixel array unit 150.

Figure 16A:
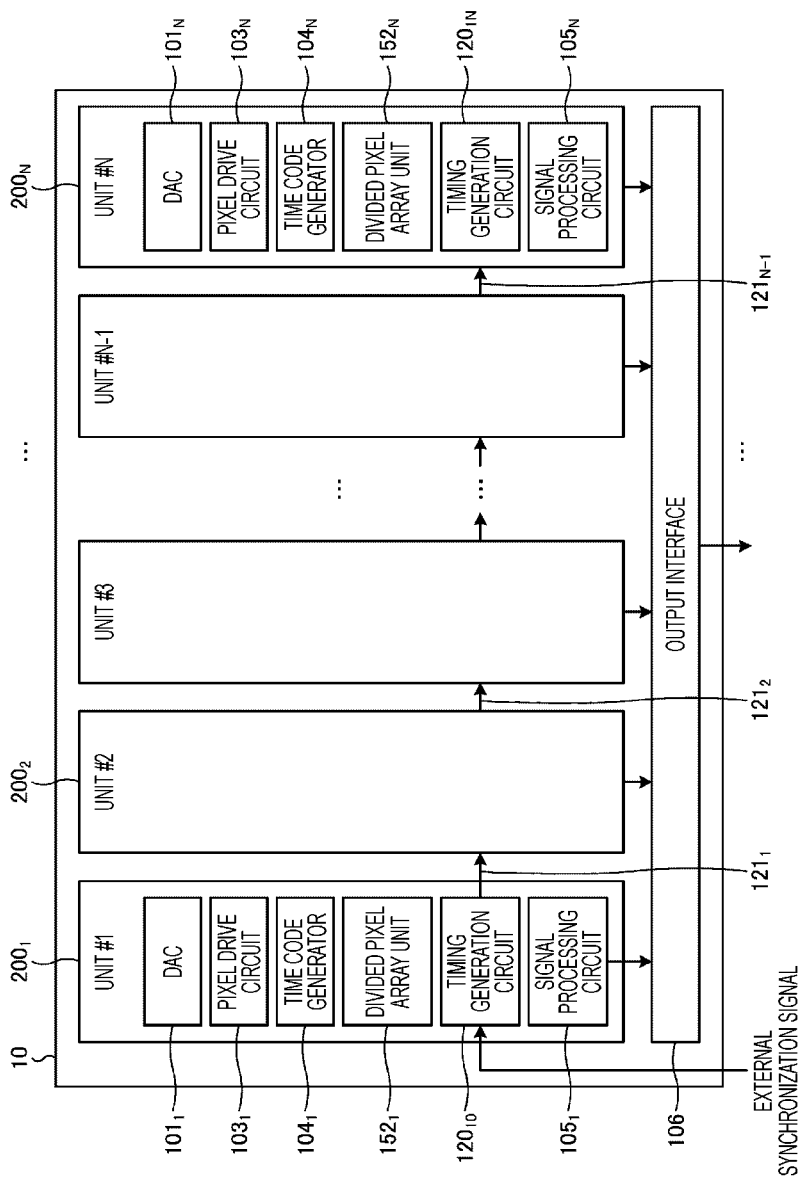
FIG. 16A is a schematic diagram illustrating a configuration of an example of a solid state imaging element according to a second modification of the embodiment.

FIG. 16A is a schematic diagram illustrating a configuration of an example of the solid state imaging element 10 according to the second modification of the embodiment. In FIG. 16A, the solid state imaging element 10 includes a plurality of units $200_1$, $200_2$, ..., and $200_N$, and the units $200_1$, $200_2$, ..., and $200_N$ includes divided pixel array units $152_1$ to $152_N$ obtained by dividing the pixel array unit 150 according to the number of units $200_1$ to $200_N$, respectively. Note that, in FIG. 16A, the units $200_1$, $200_2$, ..., and $200_N$ are also referred to as units #1, unit #2, ..., and unit #N, respectively.

The units $200_1$ to $200_N$ includes the DACs $101_1$ to $101_N$, the pixel drive circuits $103_1$ to $103_N$, the time code generators $104_1$ to $104_N$, the timing generation circuits $120_{10}$ to $120_{1N}$, and the signal processing circuits $105_1$ to $105_N$ on a one-to-one basis, respectively. Note that the output interface 106 is provided in common for the respective units $200_1$ to $200_N$.

Figure 16B:
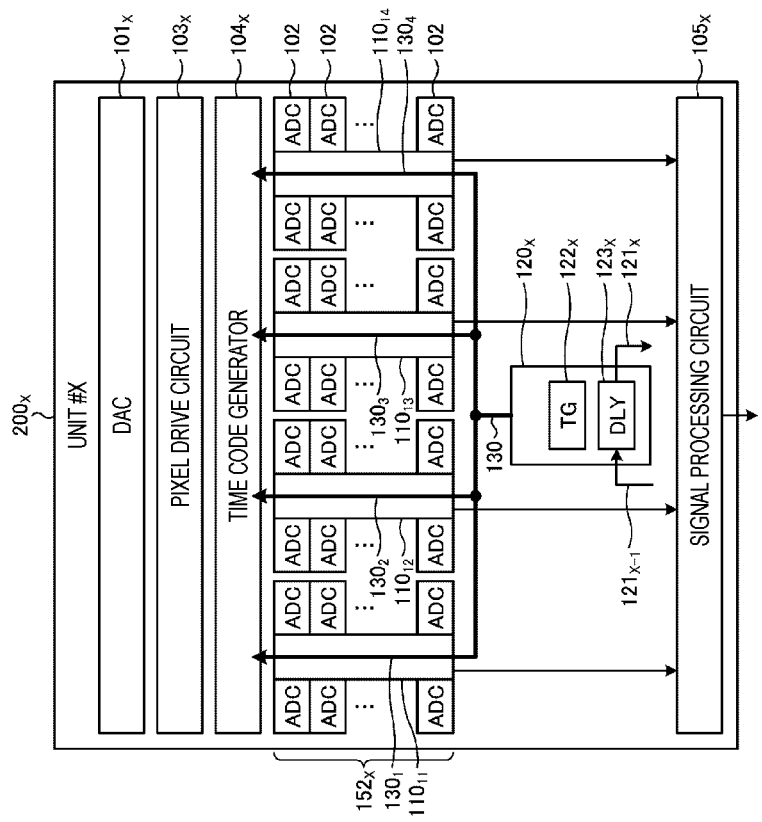
FIG. 16B is a block diagram more specifically illustrating a configuration of an arbitrary unit among the units according to the second modification of the embodiment.

FIG. 16B is a block diagram more specifically illustrating a configuration of any unit $200_X$ (unit #X) among the units $200_1$ to $200_N$ according to the second modification of the embodiment. As illustrated in FIG. 16B, the unit $200_X$ includes a DAC $101_X$, a pixel drive circuit $103_X$, a divided pixel array unit $152_X$, a timing generation circuit $120_X$, and a signal processing circuit $105_X$. In addition, in the example of FIG. 16B, four transfer circuits $110_{11}$, $110_{12}$, $110_{13}$, and $110_{14}$ are disposed in the unit $200_X$.

Timing generation circuit $120_X$ receives a synchronization signal $121_{X-1}$ from, for example, a left adjacent unit #(X−1), generates a timing signal on the basis of the synchronization signal $121_{X-1}$ to output it, and passes a synchronization signal $121_{X-1}$ as a synchronization signal $121_X$ to, for example, a right adjacent unit #(X+1).

The timing signal generated by the timing generation circuit $120_X$ is transmitted to the control line 130. The control line 130 is branched into four control lines $130_1$, $130_2$, $130_3$ and $130_4$, which are disposed in the transfer circuits $110_{11}$, $110_{12}$, $110_{13}$ and $110_{14}$ on a one-to-one basis, respectively. The control lines $130_1$, $130_2$, $130_3$, and $130_4$ include control lines 130a, 130b, 130c, and 130d (not shown), respectively.

The timing signal is supplied to the DAC $101_X$, the pixel drive circuit $103_X$, and the time code generator $104_X$ via the control lines $130_1$, $130_2$, $130_3$, and $130_4$. At this time, as described in the first modification of the embodiment, in each of the transfer circuits $110_{11}$, $110_{12}$, $110_{13}$, and $110_{14}$, the timing signals transmitted through the control lines 130a to 130d can be appropriately thinned out.

The pixel data read from each pixel 11 is supplied to the signal processing circuit $105_X$ via the corresponding transfer circuits $110_{11}$, $110_{12}$, $110_{13}$, and $110_{14}$.

As described above, with the configuration in which the generation and transmission of the timing signal are performed for each unit, for example, even in a case where the number of effective pixels in the pixel array unit 150 increases or decreases, it is possible to handle with the increase or decrease in units, and the derivative development of the product is easy.

Note that the effects described in the present specification are merely examples and are not limited, and other effects may be provided.

Note that the present technology can also have the following configurations.

(1)

An imaging apparatus including a pixel array in which pixels are arranged in a matrix array, each pixel including a light receiving element that generates a charge by photoelectric conversion according to received light, a pixel circuit that reads the charge from the light receiving element to output an analog signal corresponding to the charge, and a conversion circuit that compares the analog signal with a reference signal whose voltage changes with time and converts the analog signal into pixel data that is a digital signal on the basis of a time code whose value is updated every unit time according to a comparison result, a time code generation unit that generates the time code, a signal processing unit that performs a signal process on the pixel data, a timing signal generation unit that generates a timing signal for controlling at least timing at which the time code is generated in the time code generation unit, and a plurality of transfer units that transfers the time code to each of the pixels and transfers the pixel data to the signal processing unit, in which the time code generation unit is provided on a first side of the pixel array, the signal processing unit is provided on a second side, of the pixel array, opposite to the first side, the timing generation circuit is provided on the second side of the pixel array, each of the plurality of transfer units is disposed from the first side to the second side through the pixel array, and a control line for transferring the timing signal generated by the timing signal generation unit to the time code generation unit is provided in each of two or more transfer units of the plurality of transfer units.

(2)

The imaging apparatus according to the (1), in which the first side is a side along a direction of a row of the array, and each of the plurality of transfer units is provided along a direction of a column of the array.

(3)

The imaging apparatus according to the (1) or (2), in which a control line for transmitting the timing signal generated by the timing signal generation unit to the pixel circuit is further provided in two or more transfer units of the plurality of transfer units.

(4)

The imaging apparatus according to any one of the (1) to (3) further including a reference signal generation circuit that generates the reference signal, in which a control line for transmitting the timing signal generated by the timing signal generation unit to the reference signal generation circuit is further provided in two or more transfer units of the plurality of transfer units.

(5)

The imaging apparatus according to any one of the (1) to (4), in which the timing signal generation unit includes a delay adjustment unit that adjusts a delay of the timing signal between the control lines, the timing signal being transmitted through each of the control lines provided in two or more transfer units of the plurality of transfer units.

(6)

The imaging apparatus according to any one of the (1) to (5), in which the timing signal generation unit transmits the common timing signal through each of the control lines provided in each of two or more transfer units of the plurality of transfer units.

(7)

The imaging apparatus according to any one of the (1) to (6), in which the timing signal generation unit transmits the timing signal through each of the control lines provided in remaining transfer units after thinning out a predetermined transfer unit from the plurality of transfer units.

(8)

The imaging apparatus according to the (7), in which the timing signal generation unit transmits the timing signal through each of the control lines provided in remaining transfer units after thinning out transfer units according to accuracy required for the timing signal at a transfer destination from the plurality of transfer units.

(9)

The imaging apparatus according to any one of the (1) to (8), in which
a plurality of units including
a divided pixel array obtained by dividing the pixel array in a direction of the first side,
the time code generation unit that is provided on the first side of the divided pixel array and generates the time code for the divided pixel array,
the signal processing unit that is provided on the second side of the divided pixel array and performs the signal process on the pixel data output from the divided pixel array,
a timing signal generation unit that generates, for the divided pixel array, a timing signal for controlling at least timing at which the time code is generated in the time code generation unit, and
one or more transfer units disposed from the first side to the second side of the divided pixel array is disposed.

(10) The imaging apparatus according to any one of the (1) to (9) including
a first chip including a first substrate on which the light receiving element, the pixel circuit, and part of the conversion circuit are disposed, and a first wiring layer provided on the first substrate, and
a second chip including a second substrate on which the other part of the conversion circuit, the signal processing unit, and the timing generation circuit are disposed, and a second wiring layer provided on the second substrate and including the control line, a face of the second wiring layer, opposite to the second substrate being bonded to a face of the first wiring layer, opposite to the first substrate, in which
a shield layer is provided between a bonding face at which the first chip and the second chip are bonded and the control line.

(11) An electronic device including
an imaging unit including a pixel array in which pixels are arranged in a matrix array, each pixel including
a light receiving element that generates a charge by photoelectric conversion according to received light,
a pixel circuit that reads the charge from the light receiving element to output an analog signal corresponding to the charge, and
a conversion circuit that compares the analog signal with a reference signal whose voltage changes with time and converts the analog signal into pixel data that is a digital signal on the basis of a time code whose value is updated every unit time according to a comparison result,
a time code generation unit that generates the time code,
a signal processing unit that performs a signal process on the pixel data,
a timing signal generation unit that generates a timing signal for controlling at least timing at which the time code is generated in the time code generation unit, and
a plurality of transfer units that transfers the time code to each of the pixels and transfers the pixel data to the signal processing unit,
an optical unit that condenses incident light and guides the incident light to the light receiving element, and
a storage unit that stores the pixel data subjected to the signal process by the signal processing unit, in which
in the imaging unit,
the time code generation unit is provided on a first side of the pixel array,
the signal processing unit is provided on a second side, of the pixel array, opposite to the first side,
the timing generation circuit is provided on the second side of the pixel array,
each of the plurality of transfer units is disposed from the first side to the second side through the pixel array, and
a control line for transferring the timing signal generated by the timing signal generation unit to the time code generation unit is provided in each of two or more transfer units of the plurality of transfer units.

REFERENCE SIGNS LIST 10 solid state imaging element
11 pixel
13 first substrate
14, 16 wiring layer
15 second substrate
17 wiring
61 differential input circuit
100 Pixel circuit
101, $101_1$, $101_N$ DAC
102 ADC
103, $103_1$, $103_N$ pixel drive circuit
104, $104_1$, $104_N$ time code generator
105, $105_1$, $105_N$ signal processing circuit
106 output interface
110, $110_1$, $110_2$, $110_{n-1}$ transfer circuit
120, $120_1$, $120_2$, $120_N$, $120_{10}$, $1201_N$, $120a$, $120b$ timing generation circuit
$122_1$, $122_2$, $122_N$ timing generation unit
$123_1$, $123_2$, $123_N$ delay amount adjustment unit
130, $130_1$, $130_2$, $130_3$, $130_4$, $130a$, $130b$, $130c$, $130d$ control line
140 cluster
150 pixel array unit
$152_1$, $152_N$, $152_X$ divided pixel array unit
$200_1$, $200_2$, $200_N$ unit
300 light receiving chip
301 circuit chip
1000 electronic device
1101 MCK clock transfer unit
1102 FF data transfer unit
1103 REN signal transfer unit
1200 shield

The invention claimed is:

1. An imaging apparatus, comprising:
a pixel array in which pixels are arranged in a matrix array, each pixel of the pixels including:
a light receiving element configured to generate a charge by photoelectric conversion according to received light,
a pixel circuit configured to read the charge from the light receiving element to output an analog signal corresponding to the charge, and
a conversion circuit configured to:
compare the analog signal with a reference signal whose voltage changes with time; and
convert the analog signal into pixel data that is a digital signal on a basis of a time code whose value is updated every unit time according to a comparison result;
a time code generation unit configured to generate the time code;

a signal processing unit configured to perform a signal process on the pixel data;
a timing signal generation unit configured to generate a timing signal to control at least timing at which the time code is generated in the time code generation unit; and
a plurality of transfer units configured to:
  transfer the time code to each of the pixels; and
  transfer the pixel data to the signal processing unit, wherein
    the time code generation unit is provided on a first side of the pixel array,
    the signal processing unit is provided on a second side, of the pixel array, opposite to the first side,
    the timing signal generation unit is provided on the second side of the pixel array,
    each of the plurality of transfer units is disposed from the first side to the second side through the pixel array, and
    a control line that transfers the timing signal generated by the timing signal generation unit to the time code generation unit is provided in each of two or more transfer units of the plurality of transfer units.

2. The imaging apparatus according to claim 1, wherein the first side is a side along a direction of a row of the pixel array, and
each of the plurality of transfer units is provided along a direction of a column of the pixel array.

3. The imaging apparatus according to claim 1, wherein a control line that transmits the timing signal generated by the timing signal generation unit to the pixel circuit is further provided in the two or more transfer units of the plurality of transfer units.

4. The imaging apparatus according to claim 1, further comprising a reference signal generation circuit configured to generate the reference signal, wherein a control line that transmits the timing signal generated by the timing signal generation unit to the reference signal generation circuit is further provided in the two or more transfer units of the plurality of transfer units.

5. The imaging apparatus according to claim 1, wherein the timing signal generation unit
includes a delay adjustment unit configured to adjust a delay of the timing signal between control lines, and the timing signal is transmitted through each of the control lines provided in the two or more transfer units of the plurality of transfer units.

6. The imaging apparatus according to claim 1, wherein the timing signal generation unit is further configured to transmit the timing signal through each of control lines provided in each of the two or more transfer units of the plurality of transfer units.

7. The imaging apparatus according to claim 1, wherein the timing signal generation unit is further configured to transmit the timing signal through each of control lines provided in remaining transfer units after thinning out a predetermined transfer unit from the plurality of transfer units.

8. The imaging apparatus according to claim 7, wherein the timing signal generation unit is further configured to transmit the timing signal through each of the control lines provided in the remaining transfer units after thinning out transfer units according to accuracy required for the timing signal at a transfer destination from the plurality of transfer units.

9. The imaging apparatus according to claim 1, further compriding
a plurality of units including:
a divided pixel array obtained by dividing the pixel array in a direction of the first side,
the time code generation unit that is provided on the first side of the divided pixel array and further configured to generate the time code for the divided pixel array,
the signal processing unit that is provided on the second side of the divided pixel array and further configured to perform the signal process on the pixel data output from the divided pixel array,
the timing signal generation unit that is further configured to generate, for the divided pixel array, the timing signal to control at least the timing at which the time code is generated in the time code generation unit, and
the plurality of transfer units disposed from the first side to the second side of the divided pixel array.

10. The imaging apparatus according to claim 1, further comprising:
a first chip including a first substrate on which the light receiving element, the pixel circuit, and a first part of the conversion circuit are disposed, and a first wiring layer provided on the first substrate; and
a second chip including a second substrate on which a second part of the conversion circuit, the signal processing unit, and the timing signal generation unit are disposed, and a second wiring layer provided on the second substrate and including the control line, a face of the second wiring layer, opposite to the second substrate being bonded to a face of the first wiring layer, opposite to the first substrate, wherein
a shield layer is provided between a bonding face at which the first chip and the second chip are bonded and the control line.

11. An electronic device, comprising:
an imaging unit including:
  a pixel array in which pixels are arranged in a matrix array, each pixel of the pixels including:
    a light receiving element configured to generate a charge by photoelectric conversion according to received light,
    a pixel circuit configured to read the charge from the light receiving element to output an analog signal corresponding to the charge, and
  a conversion circuit configured to:
    compare the analog signal with a reference signal whose voltage changes with time; and
    convert the analog signal into pixel data that is a digital signal on a basis of a time code whose value is updated every unit time according to a comparison result,
  a time code generation unit configured to generate the time code,
  a signal processing unit configured to perform a signal process on the pixel data,
  a timing signal generation unit configured to generate a timing signal to control at least timing at which the time code is generated in the time code generation unit, and
  a plurality of transfer units configured to:
    transfer the time code to each of the pixels; and
    transfer the pixel data to the signal processing unit;
an optical unit configured to:
  condense incident light; and
  guide the incident light to the light receiving element; and a storage unit configured to store the pixel data subjected to the signal process by the signal processing unit, wherein in the imaging unit,
- the time code generation unit is provided on a first side of the pixel array,
- the signal processing unit is provided on a second side, of the pixel array, opposite to the first side,
- the timing signal generation unit is provided on the second side of the pixel array,
- each of the plurality of transfer units is disposed from the first side to the second side through the pixel array, and
- a control line that transfers the timing signal generated by the timing signal generation unit to the time code generation unit is provided in each of two or more transfer units of the plurality of transfer units.

* * * * *